United States Patent
Hirsch et al.

(10) Patent No.: US 10,088,536 B2
(45) Date of Patent: Oct. 2, 2018

(54) SAMPLE INTRODUCTION SYSTEM AND METHOD FOR POLARIZATION

(71) Applicant: Bruker Biospin Corproation, Billerica, MA (US)

(72) Inventors: Matthew Hirsch, Stoneham, MA (US); James G. Kempf, Arlington, MA (US)

(73) Assignee: Bruker Biospin Corporation, Billerica, MA (US)

( * ) Notice: Subject to any disclaimer, the term of this patent is extended or adjusted under 35 U.S.C. 154(b) by 37 days.

(21) Appl. No.: 14/671,529

(22) Filed: Mar. 27, 2015

(65) Prior Publication Data

US 2016/0282428 A1 Sep. 29, 2016

(51) Int. Cl.
*G01V 3/00* (2006.01)
*G01R 33/28* (2006.01)

(52) U.S. Cl.
CPC .................. *G01R 33/282* (2013.01)

(58) Field of Classification Search
CPC ...... G01R 33/307; G01R 33/31; G01R 33/46; G01R 33/32; G01R 33/323
USPC ........................................ 324/321, 300, 318
See application file for complete search history.

(56) References Cited

U.S. PATENT DOCUMENTS

| | | | |
|---|---|---|---|
| 5,513,498 A * | 5/1996 | Ackermann | F25B 25/005 62/51.1 |
| 6,466,814 B1 * | 10/2002 | Ardenkjaer-Larsen | A61K 49/08 324/307 |
| 6,758,059 B2 | 7/2004 | Kelly et al. | |
| 8,756,941 B2 * | 6/2014 | Snow | F17C 3/02 62/296 |
| 9,279,868 B2 * | 3/2016 | Lohman | G01R 33/282 |
| 9,329,245 B2 * | 5/2016 | Jannin | G01R 33/282 |
| 9,329,246 B2 * | 5/2016 | Jannin | G01R 33/282 |
| 2008/0104966 A1 * | 5/2008 | Stautner | F25B 9/14 62/6 |
| 2008/0290869 A1 * | 11/2008 | Hutton | G01R 33/30 324/318 |
| 2009/0016964 A1 | 1/2009 | Kalechofsky et al. | |
| 2011/0008261 A1 * | 1/2011 | Lerche | A61K 49/10 424/9.3 |
| 2011/0062392 A1 | 3/2011 | Kalechofsky et al. | |
| 2012/0256630 A1 * | 10/2012 | Leussler | G01R 33/282 324/318 |
| 2013/0107244 A1 * | 5/2013 | Doyle | G01N 21/6402 356/36 |
| 2015/0061666 A1 | 3/2015 | Kempf et al. | |

* cited by examiner

*Primary Examiner* — Giovanni Astacio-Oquendo
(74) *Attorney, Agent, or Firm* — O'Shea Getz P.C.

(57) ABSTRACT

A sample polarization system comprises an input stage that includes a sample input port configured and arranged to receive and to provide a sample molecule carrier, and cool the sample molecule carrier from a first temperature to a second temperature as it travels along a length of the input stage, and provides the sample molecule carrier at a input stage output. A closed volume having an interior receives the sample molecule carrier from the input stage output and holds a plurality of sample molecule carriers in the high magnetic field created by a magnet adjacent to the closed volume, and outputs the sample molecule carrier from a closed volume output port.

8 Claims, 2 Drawing Sheets

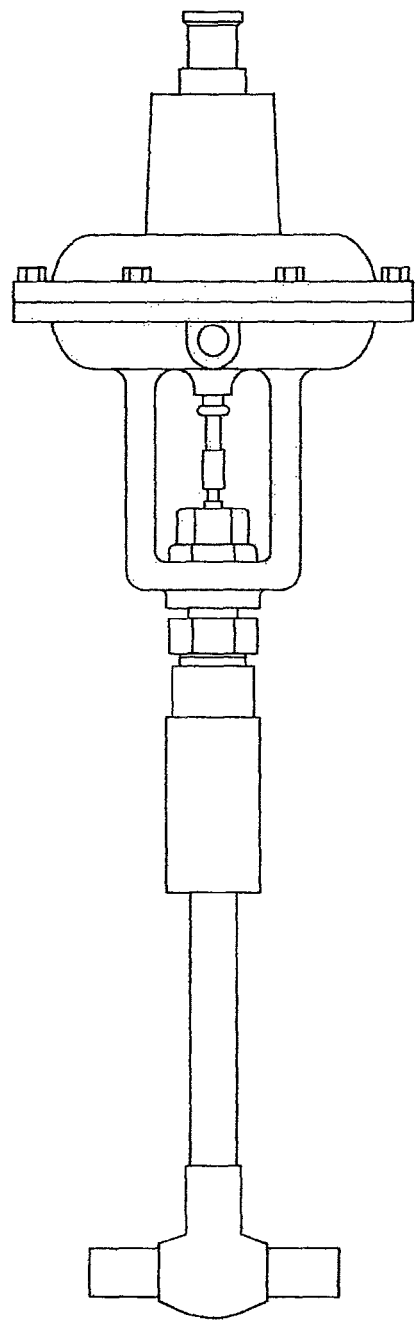
*FIG. 2* - PRIOR ART

SAMPLE INTRODUCTION SYSTEM AND METHOD FOR POLARIZATION

1. FIELD OF TECHNOLOGY

The present disclosure relates to sample handling in a cryogenic environment, and in particular to a system for polarization in a cryogenic environment comprising a gated input stage, a volume that holds a plurality of sample molecule carriers, and a gated output stage that expels a sample of magnetically polarized material from the cryogenic environment.

2. RELATED ART

A hyperpolarized nuclear spin system is one in which the nuclear magnetic moments of the sample are more strongly aligned with an external magnetic field ($B_0$) than in the Boltzmann thermal-equilibrium state for given temperature (T) and $B_0$. Such samples can provide correspondingly large signals in NMR, MRI, magnetic resonance spectroscopy (MRS), or MRS imaging (MRSI). Molecular carriers of nuclear hyperpolarization are thus highly valued as high-sensitivity probes for imaging or spectroscopy.

U.S. Patent Application Publications US2009/0016964 and US2011/0062392, both incorporated herein by reference, describe a process to generate hyperpolarization for use at moderate temperatures, by first polarizing the sample at ultra-low temperature (ULT), for example from tens to hundreds of millikelvin (mK), and high field (e.g., $B_0 > 5$ T). This relies on the fact that the usual Boltzmann polarization from ULT and high-field conditions becomes hyperpolarization if transferred to higher T and/or lower $B_0$. Co-pending U.S. patent application Ser. No. 14/161,172 discloses an improved sample preparation method for ultralow temperature hyperpolarization and is also hereby incorporated by reference.

U.S. Pat. No. 6,758,059 discloses a dilution refrigerator assembly. As discussed therein in order for a dilution refrigerator to be used to investigate samples in high magnetic environments, it is known to use an elongated, tubular extension to the mixing chamber which extends into the bore of the magnet. A problem with conventional elongated, tubular extensions, also known as an insert, is that the magnetically polarized sample material is not easily removed from the insert.

There is a need for an improved technique for inserting a sample molecule carrier into a cryogenic environment, polarizing and storing the sample molecule carrier and removing polarized sample molecule carrier from the cryogenic environment.

SUMMARY OF THE DISCLOSURE

A sample polarization system comprises an input stage that includes a sample input port configured and arranged to receive and to provide a sample molecule carrier, and cool the sample molecule carrier from a first temperature to a second temperature as it travels along a length of the input stage, and provides the sample molecule carrier at an input stage output. A closed volume having an interior receives the sample molecule carrier from the input stage output and holds a plurality of sample molecule carriers in the high magnetic field created by a magnet to the closed volume, and outputs the sample molecule carrier from a closed volume output port. An output stage that includes an output stage input receives the sample molecule carrier from the closed volume output port and warms the sample molecule carrier as it travels from the output stage input to an output stage output to provide a hyperpolarized sample molecule.

The cryogenic environment may be produced using the dilution refrigerator. A superconducting magnet may be used to maintain a magnetic field on the sample molecule carrier.

The sample may contain at least one methyl rotor group. For example, the sample molecule carrier may contain MR active nuclei such as 1H, 13C, 15N, 129Xe, 31P.

The temperature of the sample molecule carrier may be for example less than about 20 K during output from the output stage output.

In another embodiment, a sample polarization system in a cryogenic environment comprises an input stage that includes a sample input port configured and arranged to receive and to provide a sample molecule carrier to a first length of input tubing whose interior is at a first interior temperature, and a first open/close valve that receives a first valve command signal and receives the sample molecule carrier from the first length of tubing and provides the sample molecule carrier at a first valve output to a second length of input tubing whose interior is at a second interior temperature, where the second interior temperature is lower than the first interior temperature. A closed volume having an interior is configured to receive the sample molecule carrier from the third length of input tubing and hold a plurality of sample molecule carriers in the high magnetic field created by a magnet adjacent to the volume, and output the sample molecule carrier from a volume output port. An output stage includes a first length of output tubing that receives the sample molecule carrier and provides the sample molecule carrier to a first length of output tubing whose interior is at a fourth interior temperature, a third open/close valve receives a third valve command signal and receives the sample molecule carrier from the first length of output tubing and provides the sample molecule carrier in hyperpolarized form at a third valve output to a second length of output tubing whose interior is at a fifth interior temperature, where the fourth interior temperature is lower than the fifth interior temperature. A controller provides the first and second valve command signals.

In yet another embodiment a sample polarization system comprises an input stage that includes (i) a sample input port configured and arranged to receive and to provide a sample molecule carrier to a first length of input tubing whose interior is at a first interior temperature; (ii) a first open/close valve that receives a first valve command signal and receives the sample molecule carrier from the first length of tubing and provides the sample molecule carrier at a first valve output to a second length of input tubing whose interior is at a second interior temperature; and (iii) a second open/close valve that receives a second valve command signal and receives the sample molecule carrier from the second length of input tubing and provides the sample molecule carrier at a second valve output to a third length of input tubing whose interior is at a third interior temperature, where the second interior temperature is lower than the first interior temperature, and the third interior temperature is lower than the second interior temperature. A closed volume includes an interior configured to receive the sample molecule carrier from the third length of input tubing and hold a plurality of sample molecule carriers in the high magnetic field created by a magnet adjacent to the volume, and output the sample molecule carrier from a volume output port. An output stage includes (i) a first length of output tubing that receives the sample molecule carrier and provides the sample molecule carrier to a first length of output tubing whose interior is at a fourth interior temperature; (ii) a third open/close valve that receives a third valve command signal and receives the sample molecule carrier from the first length of output tubing and provides the sample molecule carrier at a third valve output to a second length of output tubing whose interior is at a fifth interior temperature; (iii) a fourth open/close valve that receives a fourth valve command signal and the sample molecule carrier from the second length of output tubing and provides the sample molecule carrier at a fourth valve output to a third length of output tubing whose interior is at a sixth interior temperature, where the fourth interior temperature is lower than the fifth interior temperature, and the fifth interior temperature is lower than the sixth interior temperature. A controller provides the first, second, third and fourth valve command signals. The input stage includes a first helium gas input, and the output stage includes a second, separate helium gas input, both for temperature control.

It is to be understood that the features mentioned above and those to be explained below can be used not only in the respective combinations indicated, but also in other combinations or in isolation.

These and other objects, features and advantages of the invention will become apparent in light of the detailed description of the embodiment thereof, as illustrated in the accompanying drawings.

DESCRIPTION OF THE DRAWINGS

FIG. 2 illustrates a commercially available valve that may be used in the input stage and/or the output stage.

Figure 1:
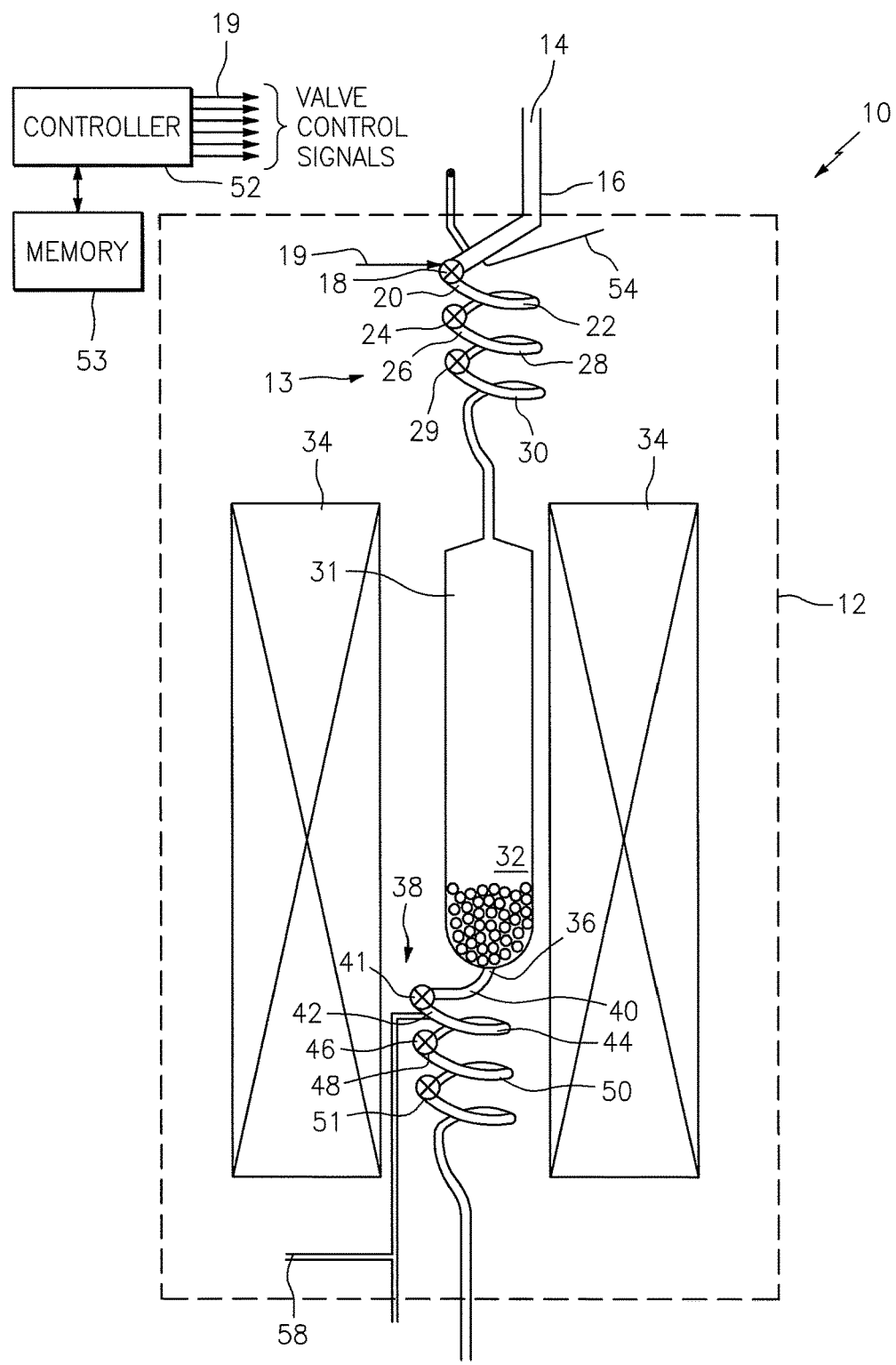
FIG. 1 illustrates a sample polarization system within a cryogenic environment, which receives sample molecule carriers at an input stage that progressively cools the sample molecule carriers and provides them to a closed volume that holds a plurality of the sample molecule carriers in the high magnetic field created by a magnet adjacent to the closed volume, and outputs hyperpolarized sample molecule carriers via an output stage that warms the sample molecule carrier as it travels along the output stage and outputs warmed sample molecule carriers.

The invention can be better understood with reference to the following drawings and descriptions. The components in the figures are not necessarily to scale, instead emphasis being placed on illustrating the principles of the invention. Moreover, in the figures, like reference numerals designate corresponding parts.

DESCRIPTION

System and method are directed to the introduction, polarization, and removal of a sample molecule in a cryogenic environment. Components of this system can be integrated into the cryogenic environment and a magnetic field producing device. The cryogenic environment can be provided by a low temperature cryostat, for example, a 4K system, a sub-2K system (e.g., pumping Helium-4, or Helium-3), or a dilution refrigerator (e.g., less than 10 mK). Components of the system may be integrated into any magnetic field producing device, including for example permanent magnets, electro magnets, standard superconducting magnets, HTS superconducting magnets. In a preferred embodiment, a temperature of less than 1 K, and a magnetic field of 10 T or greater would produce useful amounts of polarization.

A dilution refrigerator (DR) is a cryogenic device that provides continuous cooling to temperatures as low as about 2 mK, via the heat of mixing of Helium-3 and Helium-4 isotopes. A dilution refrigerator is a common piece of cryogenic equipment used throughout the scientific world. In addition, it is contemplated that the system and method disclosed herein may be used in cryogenic environments that use a cryogenic refrigerator other than a dilution refrigerator.

FIG. 1 illustrates a sample polarization system 10 within a cryogenic environment 12, which receives sample molecule carriers at an input stage 13 and progressively cools the sample molecule carriers, and provides the cooled sample molecule carriers to a closed volume that holds a plurality of cooled sample molecule carriers in a high magnetic field created by a magnet adjacent to the closed volume. Sample molecule carriers from the closed volume are output via an output stage that warms the sample molecule carrier as it travels along the output stage to provide warmed hyperpolarized sample molecule carriers.

The sample polarization system 10 includes the input stage 13 that includes a sample input port 14 configured and arranged to receive and provide a sample molecule carrier to a first length of input tubing 16, whose interior is at a first interior temperature. The first length of the input tubing 16 may have an input connection of variable temperature helium gas to controllably cool the sample from room temperature to 4 or 5 K. A first open/close valve 18 receives a first valve command signal 19 and receives the sample molecule carrier from the first length of tubing 16 and provides the sample molecule carrier at a first valve output 20 to a second length of input tubing 22 whose interior is at a second interior temperature. The second length of the input tubing 22 may be thermally connected by a thermal strap (not shown) to a section of the dilution refrigerator to cool the second length of input tubing to a nominal temperature of less than about 4 K.

A second open/close valve 24 receives a second valve command signal and receives the sample molecule carrier from the second length of input tubing 22. The second open/close valve provides the sample molecule carrier at a second valve output 26 to a third length of input tubing 28 whose interior is at a third interior temperature (e.g., less than 4 K to about 1 K). The third length of the input tubing 28 may be thermally connected by another thermal strap (not shown) to a section of the dilution refrigerator to cool the third length of input tubing. The second interior temperature is lower than the first interior temperature, and the third interior temperature is lower than the second interior temperature. The input stage 13 may also include a third open/close valve that allows the sample molecule carrier in the third length of input tubing 28 to pass into a fourth length of input tubing 30.

A closed volume 31 having an interior 32 is configured to receive the sample molecule carrier from the fourth length of input tubing 30 and hold a plurality of sample molecule carriers in a high magnetic field (e.g., between about 10 and 20 T) created by a magnet 34 adjacent to the volume. Samples within the closed volume 30 are output from a volume output port 36. Samples stored in the low temperature in the presence of the magnetic field may remain there for an extended period (e.g., months), and exit the volume in a hyperpolarized form generally first-in-first-out (FIFO) under the force of gravity. For example, as shown in FIG. 1, the sample molecule carriers enter the closed volume 31 and drop within the interior 32 and come to rest atop the sample molecule carriers already in the volume 32. As sample molecule carriers exit the volume 32 from the volume output port 36, the remaining sample molecule carriers in the volume 32 move close to the volume output port 36. One of ordinary skill in the art will appreciate that rather than the sample molecule carriers free falling from the volume inlet to the interior of the volume 32, the interior may include guides (not shown) that provide a pathway for the sample molecule carriers as they enter the volume to gently come to rest atop the sample molecule carriers already in the volume. The closed volume 31 is thermally strapped to the lowest temperature section of the dilution refrigerator.

Output stage 38 receives sample molecule carriers from the volume output port 36 of the closed volume 31. The output stage 38 includes a first length of output tubing 40 that receives the sample molecule carrier.

The first length of the output tubing 40 may be thermally connected by a first thermal output strap (not shown) to a section of the dilution refrigerator to cool the interior of the first length of output tubing to a nominal temperature of for example, between millikelvin and about 5 K. A fourth open/close valve 41 receives a third valve command signal and receives the sample molecule carrier from the first length of output tubing 40 and provides the sample molecule carrier at a fourth valve output 42. The fourth valve output 42 provides the passed sample to a second length of output tubing 44 whose interior is at a fifth interior temperature. The second length of output tubing 44 may be thermally connected to a second thermal output strap (not shown) to cool the second length of output tubing to a nominal temperature of about for example, between millikelvin and about 5 K. A fifth open/close valve 46 receives a fifth valve command signal and the sample molecule carrier from the second length of output tubing 44, and provides the sample molecule carrier at a fifth valve output 48 to a third length of output tubing 50 whose interior is at a sixth interior temperature. A sixth open/close valve 51 receives a sixth valve command signal and allows sample in the third length of output tubing 50 to pass to an output stage output. The fourth interior temperature is lower than the fifth interior temperature, and the fifth interior temperature is lower than the sixth interior temperature. The temperature of the sample output from the output stage 38 may be about 5K. Gravity is the motive force to move sample molecule carriers through the sample polarization system. However, it is contemplated that pneumatic or other motive forces may also be used. It is contemplated that a sample polarization system may use more or less valves on the input and output stages to provide a gated cooling/warm path for samples.

A controller 52 (e.g., a PC, CPU, microcontroller, et cetera) includes executable program instructions stored in non-volatile memory 53 that control the opening and closing of the valves by providing the first, second, third and fourth valve command signals. The opening and closing of the various valves to control movement of the sample molecule carrier is based upon the desired temperature cooling and warming profiles.

The input stage 13 includes a first helium gas input 54, and the output stage 38 includes a second helium gas input 58. FIG. 2 illustrates a valve that may be used in the input stage and/or the output stage (e.g., valves 18, 24, 29, 41, 46 and 51). The valve may be an actuated valve such as for example Model C30410A23 available from Cryocomp (www.cryocomp.com). It is contemplated that rather than actuated valves, a manual operation valve may also be used, such as for example Model C3041-M23 also available from Cryocomp.

The sample polarization system 10 transforms a dilution refrigerator into a nuclear-spin polarizer capable of accepting a plurality of sample molecule carriers, polarizing the nuclear spins of the sample molecule in an ultra-low temperature (ULT), high $B_0$ environment, storing the polarized sample, and outputting sample molecule carriers in a controlled manner. For this reason, the sample polarization system may include numerous lengths of input tubing and numerous length of output tubing, each for example connected to plates and thermal braids made of for example high purity copper. These elements are purposefully attached throughout the input and output stages to transmit the cooling power to the input and output stages 13, 38 respectively from the various temperature stages, i.e., plates and braids. These thermal connections prevent the heat that is transmitted down the input stage from reaching the ultimate ULT stage. This allows the closed volume 31 to reach millikelvin temperatures, for example.

The sample polarization system outputs the hyperpolarized sample from the polarizing environment, either for transport/storage in more-moderate conditions (i.e., a lower ratio of $B_0$ to T) or for immediate melting and usage. In completing that transport, the sample polarization system converts the nuclear spin polarization established in ULT and high-$B_0$ conditions into 'hyperpolarization', i.e., a spin polarization that exceeds the well-known Boltzmann equilibrium value for the new conditions of lower ($B_0$/T).

In primary applications for such hyperpolarized samples, the molecules are used as ultrasensitive probes for nuclear magnetic resonance (NMR), magnetic resonance imaging (MRI), magnetic resonance spectroscopy (MRS) and MRS imaging (MRSI). The sample polarization system described herein utilizes the cooling power and ULT, high-$B_0$ environment of the dilution refrigerator to convert a molecule with near-zero spin polarization into one whose polarization approaches the ideal value of P=1. Traditional NMR/MRI/MRS/MRSI observe signals from only very weakly polarized nuclear spins (e.g., $P \sim 10^{-5}$-$10^{-6}$). Thus, when the sample polarization system instead provides P approaching 1 for in vivo use near room or body temperature, then dramatic imaging enhancements are available, namely ultrasensitive and essentially background-free detection of signals from the hyperpolarized nuclei. An example target molecule is pyruvic acid, typically enriched with $^{13}C$ at the $C_1$ carbon site. This and other molecules are well-known targets of MRI/MRS/MRSI measurements, for example, enabling the imaging of metabolic processes to illuminate cancer diagnoses, inform treatment protocols and to test drug efficacy. That is possible using $^{13}C$ hyperpolarization levels that yield nearly up to 5 orders-of-magnitude sensitivity enhancements.

It is contemplated that temperature monitoring and control may be used throughout the sample polarization system 10. Thermometers and heaters may be attached to input and output tubing sections, for example. These enable monitoring of the temperature of the sample molecule carriers within various locations of the input stage, the volume and the output stage.

The sample molecule carrier may include a spherical film affixed or frozen to the interior of a form of some other rigid material that provides a carrier. See example, U.S. patent application Ser. No. 14/161,172, incorporated herein by reference. The form protects the sample, while allowing either helium submersion or film flow to transmit cooling power to a large surface area of the sample.

A gas handling system (GHS) located near the dilution refrigerator controls the variable temperature helium gas and pumping lines on the input and output stages.

The components of the sample polarization system 10 are preferably designed such that they can be readily incorporated into any commercially available cryogenic environment including for example dilution refrigerator platforms such as so-called "wet", "dry", "bottom loading" or "top loading" units. With the addition of a substantial magnetic field, such as that produced by a superconducting magnet, the device can be used to introduce samples into, and provide polarized samples from, a very high B/T environment suitable for producing large nuclear polarizations in a variety of molecules.

The sample polarization system 10 warms the sample(s) in the output stage 38 from millikelvins to possibly 5K while still exposed to the high $B_0$ environment. This is beneficial for polarization applications because nuclear polarization can decay rapidly once the sample is removed from the high B/T environment. This is especially the case when the target molecule contains one or more methyl rotor groups. As described in U.S. Patent Application Publication US2011/006239, the details of which are incorporated here by reference, the presence of a methyl rotor group can cause the rate of nuclear magnetization loss (known in the art as $T_1^{-1}$) in one or more nuclei in the material to be very rapid. The rate of polarization loss is particularly severe if the temperature of the material is at or near where the rotational correlation frequency of the methyl group is close to that of the nuclear Larmor frequency. This temperature regime is known in the art as the "valley of death" and can cause the material to lose all or most of the polarization that was induced at lower temperatures. Relaxation times in the "valley of death" are also generally a function of the ambient magnetic field, becoming even faster as the field is lowered.

As described in U.S. Patent Application Publication US2011006239, expelling the sample in the solid state permits it to then be transported, if desired, from one site to another without excessive polarization loss. The sample polarization system 10 facilitates maintaining the sample at a desired ambient magnetic field as the sample is warmed in the output stage 38.

Although the present invention has been illustrated and described with respect to several preferred embodiments thereof, various changes, omissions and additions to the form and detail thereof, may be made therein, without departing from the spirit and scope of the invention.

What is claimed is:

1. A sample polarization system within a cryogenic environment, comprising:
   an input stage that includes a sample input port configured and arranged to receive and to provide a sample molecule carrier that includes a sample, and cool the sample molecule carrier from a first temperature to a second temperature as it travels along a length of the input stage, and provides the sample molecule carrier at a input stage output;
   a closed volume having an interior configured to receive the sample molecule carrier from the input stage output and hold a plurality of sample molecule carriers in a high magnetic field created by a magnet adjacent to the closed volume, and output the sample molecule carrier from a closed volume output port, where the sample is in a hyperpolarized solid form; and
   an output stage that includes an output stage input that receives the sample molecule carrier from the closed volume output port and warms the sample molecule carrier as it travels from the output stage input to an output stage output, and the sample is output from the output stage in hyperpolarized solid form.

2. The sample polarization system of claim 1, where the magnet comprises a superconducting magnet that maintains a large magnetic field on the sample.

3. The sample polarization system of claim 1, where the magnet is configured and arranged to maintain the high magnetic field on the sample in the output stage.

4. The sample polarization system of claim 1, where the sample contains at least one methyl rotor group.

5. The sample polarization system of claim 4, where the sample contains magnetic resonance (MR) active nuclei such as 1H, 13C, 15N, 129Xe, 31P.

6. A sample polarization system within a cryogenic environment, comprising:
   an input stage that includes a sample input port configured and arranged to receive and to provide a sample molecule carrier to a first length of input tubing whose interior is at a first interior temperature, and a first open/close valve that receives a first valve command signal and receives the sample molecule carrier from the first length of tubing and provides the sample molecule carrier at a first valve output to a second length of input tubing whose interior is at a second interior temperature, where the second interior temperature is lower than the first interior temperature;
   a closed volume having an interior configured to receive the sample molecule carrier from a third length of input tubing and hold a plurality of sample molecule carriers in a high magnetic field created by a plurality of magnets adjacent to the volume, and output the sample molecule carrier from a volume output port;
   an output stage that includes a first length of output tubing that receives the sample molecule carrier and provides the sample molecule carrier to a first length of output tubing whose interior is at a fourth interior temperature, a third open/close valve that receives a third valve command signal and receives the sample molecule carrier from the first length of output tubing and provides the sample molecule carrier at a third valve output to a second length of output tubing whose interior is at a fifth interior temperature, where the fourth interior temperature is lower than the fifth interior temperature; and
   a controller that provides the first and second valve command signals.

7. The sample polarization system of claim 6, where the cryogenic environment is produced using a dilution refrigerator.

8. A sample polarization system within a cryogenic environment, comprising:
   an input stage that includes
      a sample input port configured and arranged to receive and to provide a sample molecule carrier to a first length of input tubing whose interior is at a first interior temperature;
      a first open/close valve that receives a first valve command signal and receives the sample molecule carrier from the first length of tubing and provides the sample molecule carrier at a first valve output to a second length of input tubing whose interior is at a second interior temperature;
      a second open/close valve that receives a second valve command signal and receives the sample molecule carrier from the second length of input tubing and provides the sample molecule carrier at a second valve output to a third length of input tubing Whose interior is at a third interior temperature, where the second interior temperature is lower than the first interior temperature, and the third interior temperature is lower than the second interior temperature;

a closed volume having an interior configured to receive the sample molecule carrier from the third length of input tubing and hold a plurality of sample molecule carriers in a high magnetic field created by a magnet adjacent to the volume, and output the sample molecule carrier from a volume output port;

an output stage that includes a first length of output tubing that receives the sample molecule carrier and provides the sample molecule carrier to a first length of output tubing whose interior is at a fourth interior temperature;

a third open/close valve that receives a third valve command signal and receives the sample molecule carrier from the first length of output tubing and provides the sample molecule carrier at a third valve output to a second length of output tubing whose interior is at a fifth interior temperature;

a fourth open/close valve that receives a fourth valve command signal and the sample molecule carrier from the second length of output tubing and provides the sample molecule carrier at a fourth valve output to a third length of output tubing whose interior is at a sixth interior temperature, where the fourth interior temperature is lower than the fifth interior temperature, and the fifth interior temperature is lower than the sixth interior temperature; and a controller that provides the first, second, third and fourth valve command signals, where the input stage includes a first helium gas input, and the output stage includes a second helium gas input.

* * * * *